United States Patent [19]

Bristol

[11] 4,266,144
[45] May 5, 1981

[54] DETECTION MEANS FOR MULTIPLE CAPACITIVE SENSING DEVICES

[75] Inventor: Robert G. Bristol, Everett, Mass.

[73] Assignee: Emhart Industries, Inc., Indianapolis, Ind.

[21] Appl. No.: 38,520

[22] Filed: May 14, 1979

[51] Int. Cl.³ .................................................. H01H 36/00
[52] U.S. Cl. ...................................... 307/116; 307/143; 73/304 C
[58] Field of Search ................... 307/116, 39, 42, 99, 307/118, 130, 143, 144; 200/DIG. 1; 324/61 R; 73/304 C

[56] References Cited

U.S. PATENT DOCUMENTS

| | | | |
|---|---|---|---|
| 3,492,440 | 1/1970 | Cerbone | 200/DIG. 1 |
| 3,935,739 | 2/1976 | Ells | 73/304 C |
| 4,099,167 | 7/1978 | Pomerantz | 340/620 |
| 4,177,421 | 12/1979 | Thornburg | 200/DIG. 1 |

Primary Examiner—L. T. Hix
Assistant Examiner—Stafford D. Schreyer
Attorney, Agent, or Firm—Robert F. Meyer; David W. Gomes

[57] ABSTRACT

A detection circuit for detecting discrete states of multiple capacitive sensing devices in a continuum provides an output which is linearly variable with respect to changes in the states of the sensing devices. The circuit uses either a time interval measurement or voltage measurement which has a magnitude which linearly corresponds to changes in the states of the sensing devices. By continuously monitoring these outputs, a continuous indication of discrete changes in the states of the sensing devices is detectable. In accordance with the present invention, a single drive electrode and a single sense electrode in combination with a plurality of sensing devices capacitively transmit electrical pulses in accordance with the various states of the sensing devices whereby the detection circuit detects discrete changes in a state of the sensing devices in a continuum.

13 Claims, 9 Drawing Figures

DETECTION MEANS FOR MULTIPLE CAPACITIVE SENSING DEVICES

The present invention relates to detection circuits for detecting and indicating various states e.g. touch and no-touch conditions of capacitive sensing devices. Furthermore, the present invention is adaptable for multiplexing a plurality of different groups of capacitive sensing devices wherein each group of sensing devices is being used for a different purpose. For example, a capacitive touch panel may be multiplexed with a capacitive liquid level sensor using the detection means of the present invention.

Generally speaking, the detection circuits of the present invention include a source of electrical pulses for driving the sensing devices and circuit means responsive to the electrical pulses and to a change of state of the sensing devices. The present invention is capable of detecting discrete states of multiple sensing devices in a continuum by providing an output which is linearly variable with respect to changes in the state of the sensing devices. Also included within the scope of the present invention is a method of detecting various states of capacitive sensing devices in a continuum which includes the steps of applying a source of electrical pulses to drive the sensing devices, capacitively transmitting the electrical pulses in accordance with a state of the sensing devices, and providing an output which is linearly variable in a continuum with respect to changes in the states of the sensing devices. Importantly, the detection circuit and method of the present invention utilize either a time interval or voltage magnitude measurement which is continuously monitored to detect the various states of the sensing devices and provide a continuous indication of changes in the states of the sensing devices.

Conventional detection circuits, such as the one illustrated in FIG. 1, have used the magnitude of a voltage pulse being capacitively transmitted from the sensing device and compared the pulse to a threshold voltage to determine the various states of the sensing devices. For example, Louis M. Sandler discloses in his co-pending applications Ser. No. 895,755 entitled "Detection Means For Touch Control Switches" and Ser. No. 905,583 "Multiplexing Scheme For Touch Control Systems" various detection circuits which have heretofore been used to detect the states of capacitive sensing devices. In each of these co-pending applications the magnitude of a voltage pulse capacitively transmitted by the sensing devices, is compared to a threshold voltage to determine the state of the sensing devices. However, each of these circuits requires either individual drive supply sources or individual circuit means in order to detect multiple sensing devices. These conventional detection circuits have individually detected the states of the sensing devices. In other words as each capacitive sensing device is touched the magnitude of the electrical pulse corresponding thereto is typically compared to a different threshold voltage.

Problems which have commonly been associated with these conventional detection circuits are (1) the high sensitivity of such circuits to stray capacitance thereby requiring an adjustable element to be included in the circuit, (2) limitation as to the number of sensing devices capable of being multiplexed without the necessity for additional circuitry, (3) the requirement for either a plurality of sensing electrodes or drive electrodes corresponding to the number of capacitive sensing devices due to the discrete nature of such circuits, (4) the requirement that the electrical connections between the sensing electrodes and the detection circuit be very short and completely isolated from ground potential and other spurious or transient signals and (5) the inability to detect small changes in the states of the sensing devices.

Accordingly, one aspect of the present invention is to provide a detection circuit for detecting states of multiple sensing devices in a continuum having an output which varies linearly with respect to changes in the states of the sensing devices. Another aspect of the present invention is to provide a detection circuit which utilizes a time interval measurement in lieu of the comparison of the magnitude of a voltage pulse to a threshold. Yet another aspect of the present invention, is to provide a detection circuit which continuously monitors the change in magnitude of the output wherein changes in magnitude correspond to changes of the states of the sensing devices. A further aspect of the present invention is the ability to detect a plurality of states of sensing devices utilizing a single drive electrode and a single sense electrode. In addition, another aspect of the present invention is reduced complexity and cost when multiplexing multiple sensing devices.

The detection circuit of the present invention is insensitive to stray capacitance and therefore the circuitry may be remotely located from the sensing electrode by utilizing a shielded cable to electriclly couple the sensing electrode to the detection circuitry.

By appropriately arranging the sensing devices each discrete change in the states thereof can be continuously monitored.

Importantly, the detection circuit of the present invention has the capabilities of conventional detection circuits and in addition can provide an output signal proportional to the number of sensing devices whose states have been modified.

In accordance with the various aspects of the present invention as described hereinabove, a plurality of capacitive sensing devices performing various functions in an apparatus such as a dishwasher or washing machine may be multiplexed wherein various sensing devices from each functional group of sensing devices are detectable utilizing a single sensing electrode and a single drive electrode. For example, a group of capacitive sensing devices for measuring the level of a liquid may be multiplexed with a group of capacitive sensing devices which are included in a touch panel for programming the operation of an apparatus.

A method of detecting various states of capacitive sensing devices in a continuum in accordance with the present invention includes the steps of applying a source of electrical pulses to drive the sensing devices, capacitively transmitting the electrical pulses in accordance with a state of the sensing devices and providing an output which is linearly variable in a continuum with respect to changes in the states of the sensing devices.

Other features and advantages of the present invention will be apparent from the following detailed description of a preferred embodiment thereof, which description should be considered in conjunction with the accompanying drawings in which.

Figure 1:
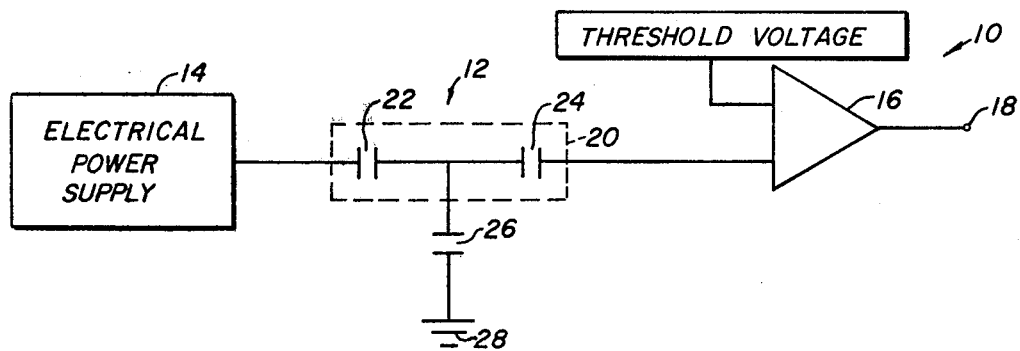
FIG. 1 is a schematic circuit diagram of a conventional detection circuit for detecting the state of a single capacitive sensing device.

A detection circuit 10 which has heretofore been employed for detecting various states of a capacitive sensing device 12 includes an electrical power supply source 14 for providing a series of electrical drive pulses to the capacitive sensing device 12 and a means 16 for comparing the magnitude of the capacitively transmitted voltage pulses to a threshold voltage. An output 18 of the detection circuit provides an elecrical signal indicative of a state of the capacitive sensing device 12 when the magnitude of the capacitively transmitted electrical drive pulses transits the threshold voltage. As illustrated in FIG. 1, an electrical equivalent 20 of capacitive sensing device 12 typically includes a drive capacitor 22 representative of the capacitance formed between the drive electrode (not shown) and the conductive or touch strip of material located in spaced relation thereto and a sense capacitor 24 representative of the capacitance formed between the strip of conductive material and the sense electrode (not shown). When the conductive strip of material is touched or a liquid is provided in proximity thereto, a shunt capacitance 26 is established between the conductive strip and ground potential 28 whereby the electrical pulses provided by electrical power supply 14 are shunted to ground potential thereby decreasing the magnitude of the electrical signals. The decrease in magnitude is compared to the threshold voltage whereby an indication is provided at output 18 in accordance with the state of sensing device 12. Only if the magnitude of the electrical signals is less than the threshold voltage is a change in state indicated. Accordingly, the detection circuit 10 is limited to detection of one state and cannot provide a continuous monitoring of a plurality of states.

As previously indicated, one of the major problems associated with the conventional detection circuit 10 is its sensitivity to stray capacitances. Accordingly, it has heretofore been necessary for the circuitry 10 to be located in close proximity to the sense electrode (not shown) in order to avoid any stray capacitance which may be established in the electrical conduit connecting the sense electrode to the associated circuitry.

As is well known to those skilled in the art, the conventional detection circuit 10 detects the particular state of the capacitive sensing device 12 in a discrete manner by comparing the magnitude of each voltage pulse to the threshold voltage. Accordingly, multiplexing a plurality of sensing devices has required multiple electrical power supplies 14 and/or multiple means 16 for comparing the magnitude of the voltage pulses to a threshold voltage for each state of the sensing devices and therefore has proved to be costly. As disclosed in Louis M. Sandler's co-pending application Ser. No. 905,583 "Multiplexing Scheme For Touch Control Systems", various schemes have been proposed for multiplexing a plurality of capacitive sensing devices 12 utilizing the conventional detection method associated with the circuit 10 shown in FIG. 1. However, the number of capacitive sensing devices 12 which may be multiplexed utilizing a single electrical power supply 14 or a single means 16 for comparing the electrical pulses to a threshold voltage is limited unless some additional circuitry is included to alternately enable various capacitive sensing devices. Clearly, the requirement for additional circuitry adds to the cost and complexity of any multiplexing scheme. Furthermore, the stray capacitance associated with these previous arrangements has severely limited the multiplexing capabilities and the physical arrangement of the sensing devices.

Figure 2:
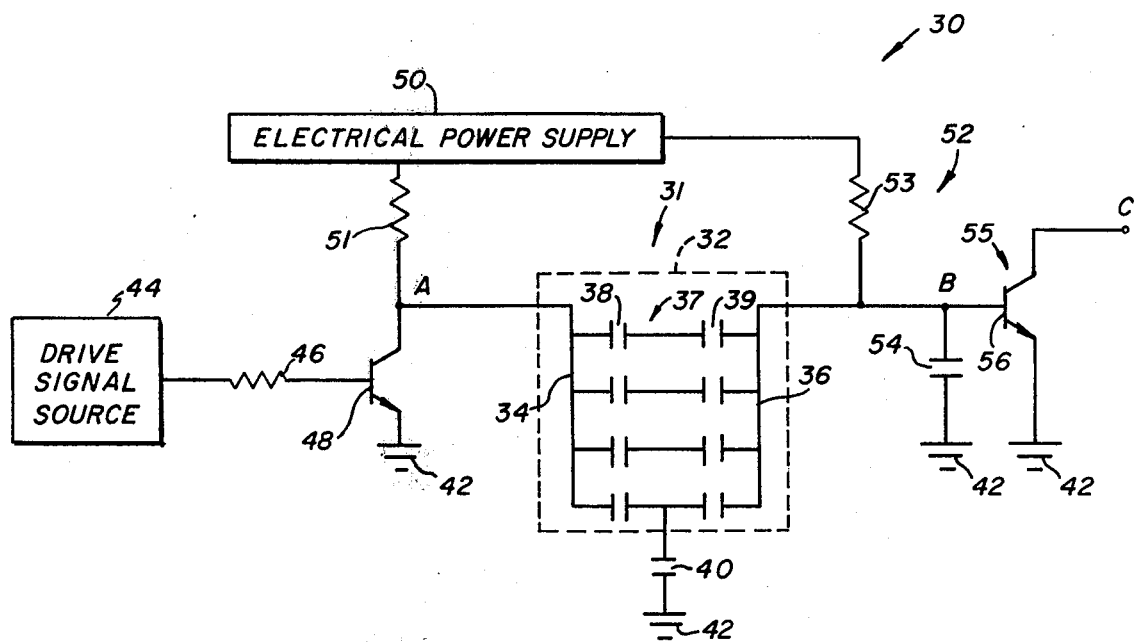
FIG. 2 is a schematic circuit diagram of an embodiment of the detection circuit of the present invention for detecting states of multiple capacitive sensing devices in a continuum.

Illustrated in FIG. 2 is a detection circuit 30 for detecting various states of multiple capacitive sensing devices 31 in a continuum which employs a time interval measurement vis-a-vis the progressive modification of electrical pulses in response to changes in the states of the sensing devices 31. Accordingly, in the detection circuit 30 illustrated in FIG. 2, the various states of capacitive sensing devices 32 are detected in a continuum by converting current to time intervals indicative of the various states of the capacitive sensing devices. Furthermore, as will be described in more detail in conjuction with FIG. 7 the time interval can be made to vary linearly with respect to the states of the sensing devices 31.

The electrical equivalent 32 of the multiple capacitive sensing devices 31 includes a single drive electrode 34 which is capacitively coupled to a single sense electrode 36 through a plurality of capacitances 37 formed between the drive electrode 34 and sense electrode 36. Each pair of capacitors 38 and 39 may correspond to a liquid level or a particular function of an apparatus. As the liquid level changes or the number of sensing devices touched increases, capacitive sensing devices 31 assume various states. As previously discussed, when a particular capacitive sensing device is touched or a liquid is provided in proximity thereto, a shunt capacitance 40 is formed and a portion of the capacitively transmitted drive signal is shunted to ground potential 42.

Figure 7:
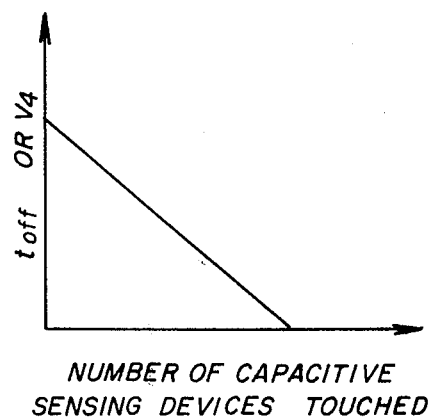
FIG. 7 is a graphical representation of the linear relationship between the states of the sensing devices and the output of the embodiments shown in FIGS. 2 and 5.

Included within the embodiment of detection circuit 30 shown in FIG. 2 is a drive signal source 44 which is elecrically coupled through a biasing resistor 46 to a bipolar switching device 48. In the preferred embodiment, the bipolar switching device 48 is an NPN transistor. The emitter of transistor 48 is electrically coupled to ground potential 42 and the collector is electrically coupled to an electrical power supply 50 through a biasing resistor 51 and also to the single drive electrode 34 associated with the capacitive sensing devices 31. A circuit means 52 includes circuit element 55 which may be another bipolar switching device 56 such as an NPN transistor. Transistor 56 has its base electrically coupled to the sense electrode 36 of the capacitive sensing devices 31. The transistor 56 is normally biased on by resistor 53. Resistor 53 is electrically coupled to an electrical power supply 50 which provides the necessary power to maintain transistor 56 in its normally on or first mode of operation. Transistor 56 further has its emitter electrically coupled to ground potential 42 and its collector electrically coupled to an output (Junction C) of the detection circuit 30. A capacitor 54 electrically coupled to the base of transistor 56 and to ground potential 42 in conjuction with resistor 53 provide a RC circuit for determining the period of time during which transistor 56 will operate in a second mode of operation (turned off). As will be described in more detail hereinafter, the time period associated with the second mode of operation of transistor 56 is variable in a continuum with respect to changes in the states of capacitive sensing devices 31. Furthermore, as illustrated in FIG. 7, the time period may be a negative linear function of the states of the sensing devices 31 i.e. the time period decreases linearly with respect to the number of sensing devices 31 being touched. Therefore, as the number of capacitive sensing devices 31 being touched or shunted to ground potential 42 by a liquid increases, the time period associated with the second mode of operation of transistor 56 decreases.

Figure 3:
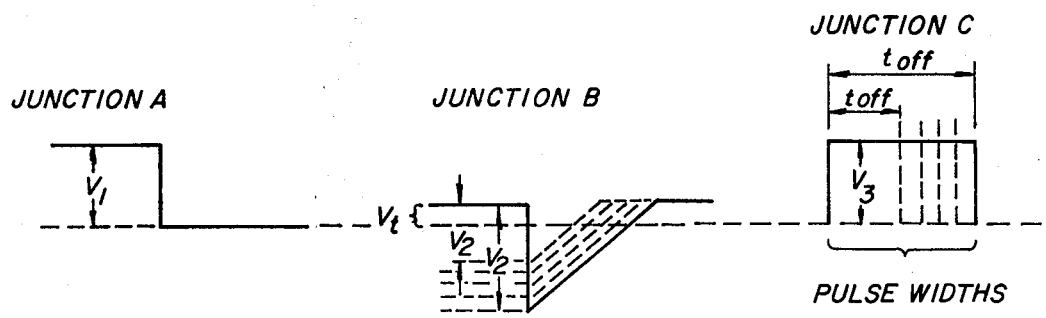
FIG. 3 illustrates various waveforms taken at several selected locations in the embodiment shown in FIG. 2.

The operation of detection circuit 30 can best be described by referring to FIGS. 2, 3, and 7 wherein the various waveforms shown in FIG. 3 have been selected from various junctions A, B, and C of circuit 30 and FIG. 7 illustrates the continuous linear relationship between the output of detection circuit 30 and the states of the sensing devices 31. At junction A, a negative-going voltage step having a magnitude $V_1$ is applied by drive signal source 44 to the drive electrode 34 of capacitive sensing devices 31. A negative-going impulse of current corresponding to the state of sensing devices 31 is capacitively transmitted between junctions A and B. At junction B, a voltage pulse has a magnitude $V_2$ which is variable in accordance with the state of the capacitive sensing devices 31. As shown in FIG. 3, the positive portion of voltage $V_2$ at junction B, i.e. $V_t$, represents the voltage required to activate or turn on circuit element 55. The voltage $V_t$ is supplied by biasing resistor 53 in conjunction with electrical power supply 50. Accordingly, until such time as a negative-going voltage $V_1$ is capacitively transmitted by capacitive sensing devices 31, the circuit element 55 is turned on or operates in a first mode of operation. After the signal $V_1$ is capacitively transmitted, the voltage $V_2$ at junction B becomes negative and circuit element 55 is turned off or operates in a second mode of operation. As the number of touched sensing devices 31 increases, more and more of the current impulse is shunted to ground potential and the magnitude $V_2$ of the signal at junction B correspondingly becomes smaller. By arrangement of the geometry of the capacitive sensing devices 31, the voltage waveform $V_3$ at the output of detection circuit 30 (junction C) can be caused to linearly decrease in pulse width as the amount of the voltage $V_1$ shunted to ground increases. The voltage waveform $V_3$ provided at junction C is representative of the time period during which circuit element 55 is off or operating in its second mode of operation. Accordingly, an increase in the amount of the current impulse which is shunted to ground potential 42 causes a decrease in magnitude of the voltage pulse $V_2$ at junction B which in turn results in a decrease in the pulse width of the electrical pulse $V_3$ at junction C. The decrease in pulse width $t_{off}$ of voltage $V_3$ at junction C provides a continuous indication of the number of capacitive sensing devices 31 being touched or shunted to ground potential 42 by a liquid.

As previously described, an important feature or advantage of the present invention is that detection circuit 30 is relatively insensitive to variations in supply voltage and stray capacitance. By way of derivation, the equations representing the voltage at junction B support this important feature of detection circuit 30. At junction B:

$$\frac{V_2}{V_1} = \frac{C_{38} C_{39}}{C_{39} C_{54} + C_{38} C_{54} + C_{38} C_{39} + C_{40} C_{54} + C_{39} C_{40}}$$

For $C_{38} = C_{39}$ and $C_{38} < C_{54}$ $$\frac{V_2}{V_1} \approx \frac{C_{38}}{C_{54}} \left\{ \frac{1}{2 + C_{40}/C_{38}} \right\}$$

Derivation of the time period $t_{off}$ that circuit element 55 is off or in its second mode of operation is represented by the following equations:
For $V_1 > V_2$ $$i_{R53} = C_{54}\{dV_2/dt_{off}\}$$

$$i_{R53} = V_1/R_{53}$$

It should be noted that since $i_{R53}$ is a constant then:

$$dV_2/dt_{off} = V_2/t_{off}$$

$$t_{off} = R_{53} C_{54}\{V_2/V_1\}$$

Substitute $$\frac{V_2}{V_1} \approx \frac{C_{38}}{C_{54}} \left\{ \frac{1}{2 + C_{40}/C_{38}} \right\}$$

$$t_{off} = \frac{R_{53} C_{38}}{2 + C_{40}/C_{39}}$$

It should further be noted that in the final equation for the time period for which circuit element 55 is off or in the second mode of operaton $V_1$, $V_2$ and $C_{54}$ are no longer present in the equation and therefore the equation supports the insensitivity of detection circuit 30 to supply voltage variations and stray capacitances at junction B.

Where the number of capacitive sensng devices 31 is equal to N the equation for the time period $T_{off}$ during which circuit element 55 is off when no sensing devices 31 have been touched becomes:

$$T_{off} = (R_{53} C_{38}/2)(N)$$

When a number L of capacitive sensing devices 32 have been touched or a liquid provided in proximity thereto, the equation for the time period during which circuit element 55 is off becomes:

$$T_{off} = \frac{R_{53} C_{38}}{2}(N-L) + \frac{R_{53} C_{38}}{2 + C_{40}/C_{38}}(L)$$

For $C_{40} > C_{38}$ $$t_{off} \approx (R_{53} C_{38}/2)(N-L)$$

Figures 4, 9:
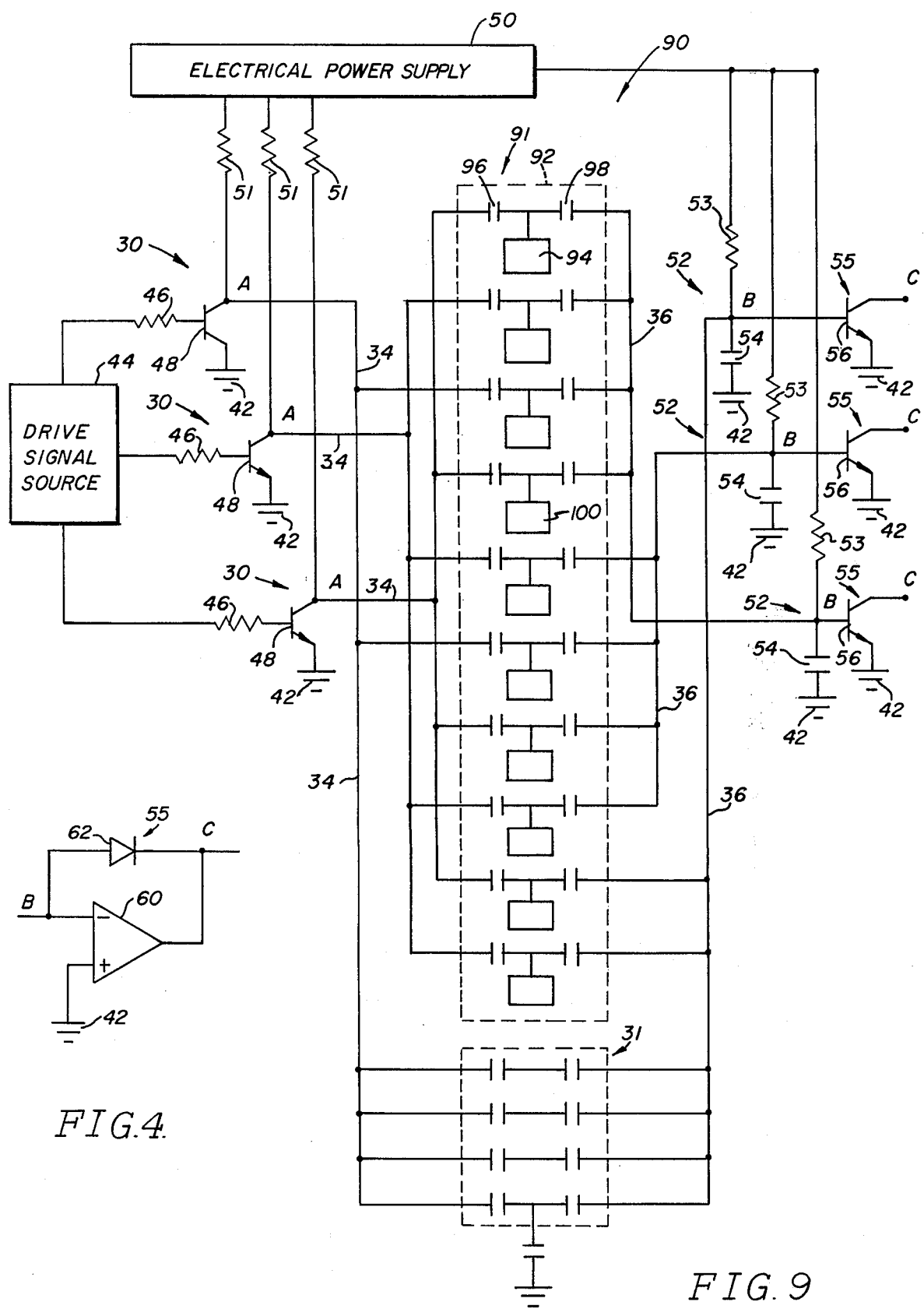
FIG. 4 is a schematic circuit diagram of an alternative embodiment of a portion of the circuit shown in FIG. 2.
FIG. 9 is a schematic circuit diagram of a multiplexing scheme constructed in accordance with the present invention.

Illustrated in FIG. 4 is an alternative embodiment for circuit element 55. As shown in FIG. 4, an operational amplifier 60 has its positive (+) non-inverting input electrically coupled to ground potential 42 and its negative (−) inverting input electrically coupled to sense electrode 36. A diode 62 coupling the output of operational amplifier 60 to its inverting input is reverse biased or off when the electrical signal at junction B is low (negative) and is forward biased or on when the electrical signal at junction B is high (positive). Since the operational amplifier 60 requires only a minimal positive voltage for it to become active, a smaller voltage waveform $V_1$ may be utilized.

Figure 5:
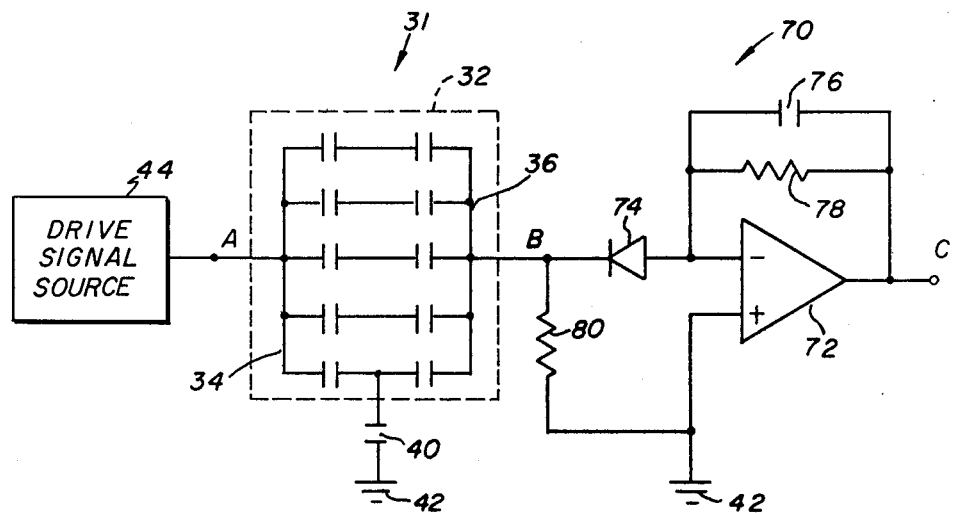
FIG. 5 is a schematic circuit diagram of an embodiment of the detection circuit of the present invention for detecting states of multiple capacitive sensing devices in a continuum.

In FIG. 5 another embodiment of a detection circuit 70 for detecting various states of multiple capacitive sensing devices 31 in a continuum is shown. Detection circuit 70 continually varies the magnitude of an output (junction C) voltage level in response to changes in the states of the sensing devices 31 vis-a-vis the progressive modification of electrical pulses supplied by drive signal source 44. Accordingly, in detection circuit 70 various states of capacitance sensing devices 31 are detected in a continuum by converting the current impulse capacitively transmitted by sensing devices 31 to a voltage which is continually and may be linearly variable with respect to variations in the states of the capacitive sensing devices 31.

Various portions of the detection circuit 70 are identical to the detection circuit 30 shown in FIG. 2 and therefore these similar portions have been correspondingly identified with the same reference numerals. Accordingly, in addition to these common features, detection circuit 70 includes an operational amplifier 74 having its negative (−) or inverting input electrically coupled to the sense electrode 36 through a diode 74. Its negative input is further coupled to its output (junction C) through the parallel combination of a capacitor 76 and resistor 78. The positive (+) or noninverting input of operational amplifier 72 is electrically coupled to ground potential 42. A resistor 80 is electrically coupled between junction B of the circuit 70 and ground potential 42. The above described combination of circuit components form a low pass filter which converts the negative current impulse which is progressively modified by changes in states of the sensing devices 31 into a DC voltage at junction C.

Figure 6:
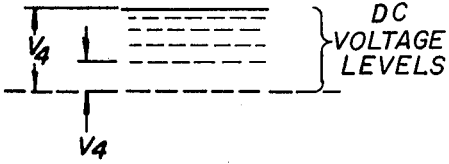
FIG. 6 illustrates various waveforms taken at several selected locations in the embodiment shown in FIG. 5.
Figure 6:

Referring to FIGS. 5, 6, and 7 a negative-going pulse $V_1$ (junction A) is applied to the capacitive sensing devices 31 by drive signal source 44. Prior to a negative going pulse from drive signal source 44, junction B is essentially at ground potential due to the presence of resistor 80. A negative impulse of current is passed through diode 74 and into capacitor 76. The presence of operational amplifier 72 limits the voltage at junction B. As a liquid is provided in proximity to a greater number of sensing devices 31 or the number of sensing devices touched becomes greater more and more of this current is shunted to ground potential 42 through shunt capacitance 40. By proper arrangement of sensing devices 31 the average value of the current flowing through capacitor 76 will vary linearly with respect to the number of capacitive sensing devices 31 shunted to ground potential 42. This current is converted to a DC voltage $V_4$ at junction C which has a magnitude which varies in accordance with variations in the current through diode 74 and capacitor 76. As shown in FIG. 7 the magnitude or level of voltage $V_4$ decreases linearly with an increase in the number of capacitive sensing devices shunted to ground potential 42. Importantly, it should be noted that this negative linear relationship between voltage $V_4$ and the number of sensing devices 31 touched is continuous. Therefore by monitoring the rate of change in such linear relationship, changes in the states of capacitance sensing devices 31 are detectable in a continuum.

Figure 8:
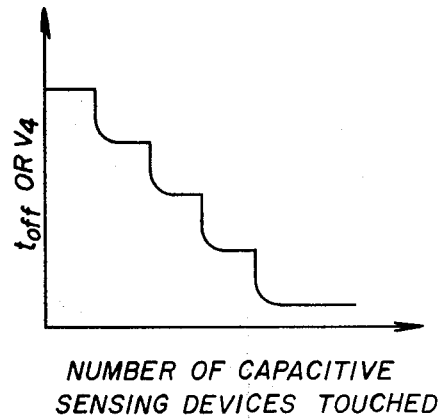
FIG. 8 is a graphical representation of the non-linear relationship between the states of the sensing devices and the output of the embodiments shown in FIGS. 2 and 5.

Shown in FIG. 8 is a graphical representation of the negative non-linear relationship which may be achieved by the detection circuits shown in FIGS. 2 and 5 between the states of the sensing devices and the outputs C of the detection circuits 30 and 70. By appropriate geometric arrangement of the sensing devices 31 a sequence of discrete step changes in the output C can be produced over a period of time in response to changes in the state of the sensing devices 31. For example, in sensing the level of a liquid an initial step may represent a low level an intermediate step may represent a medium level; and a third step may represent a high level of the liquid.

Referring now to FIG. 9 a multiplexing scheme 90 for detecting a plurality of capacitive sensing devices in a continuum including two groups of sensing devices 31 and 91 is shown employing three (3) detection circuits 30 identical to the circuit previously described in FIG. 2. Accordingly, where an electrical component is shown in FIG. 9 which is the same as or equivalent to an electrical component shown in FIG. 2 the same identifying numerals have been used. Unless necessary for the description of the multiplexing scheme 90, a description of electrical components previously described, is not provided hereinafter.

At least two groups of capacitive sensing devices 31 and 91 have been multiplexed using multiplexing scheme 90. A first group of capacitive sensing devices 31 represents sensing devices which are utilized to detect the level of a liquid provided in proximity thereto and are the same as those sensing devices discussed in conjunction with the embodiment of detection 30 shown in FIG. 2. The electrical equivalent 92 of a pluality of capacitive touch sensing devices 91 has associated therewith a capacitor 96 formed between the drive electrode 34 and a touch pad 94 and a capacitor 98 formed between the touch pad 94 and the sensing electrode 36. As will be understood, the group of capacitive touch sensing devices 91 may be subdivided into further groups in accordance with the number of detection circuits 30 employed.

A separate pulse is applied at the junctions A by drive signal source 44 thereby providing electrical pulses to three (3) drive electrodes 34 at three different points in time. Each drive electrode has associated therewith a capacitive sensing device from each of the groups of capacitive sensing devices 31 and 91. Three (3) circuit means 52 are elecrically coupled to three (3) sensing electrodes 36 and are responsive to states of capacitive sensing devices from each group of capacitive sensing devices 31 and 91. As illustrated in FIG. 9, some sensing devices from each group of sensing devices 31 and 91 will either have a common drive electrode 34 or a common sense electrode 36. The state of any one sensing device from groups 31 or 91 can be independently determined provided that the sensing device does not share both a common drive electrode 34 and a common sense electrode 36 with any other sensing device whose state is also being determined. An example of two non-independent sensing devices are touch pads 94 and 100.

For these dependent sensing devices the multiplexing scheme 90 can distinguish between the states of none, one or both being touched; however, the state of each individual sensing device can not be determined. Heretofore the state of two sensing devices being touched has been equivalent to one being touched. Accordingly, even for the dependent sensing devices of multiplexing scheme 90 an advantage is gained over the prior art.

In operation, each detection circuit 30 employed in the multiplexing scheme 90 operates substantially as previously described in FIG. 2. It can therefore be seen that the multiplexing scheme 90 provides an arrangement whereby liquid level capacitive sensing devices 31 and capacitive touch sensing devices 91 may be multiplexed simultaneously sharing the same detection circuits 30.

What is claimed is:

1. A circuit for measuring the response of a capacitance responsive sensing element, comprising:
    an electrical source means for providing a pulse signal to said capacitance responsive sensing element, said electrical source means including means for generating a square wave pulse signal; and
    circuit means for measuring the amount of said pulse signal transmitted through said capacitance responsive sensing element to provide an indication of the amount of capacitance to which said element is responding, said circuit means for measuring including a time constant circuit and means for measuring the recovery time of said time constant circuit in response to said square wave signal as an indication of the amount of said pulse signal transmitted through said capacitance responsive sensing element.

2. The circuit of claim 1, wherein said time constant circuit includes a series network comprising a capacitor and a resistor, said capacitor being connected across the output of said capacitance responsive sensing element.

3. The circuit of claim 1, wherein said capacitance responsive sensing element includes a drive electrode coupled to said electrical source means, a sensing electrode coupled to said circuit means for measuring, a shunt element capacitively coupled to receive said pulse signal from said drive electrode and capacitively coupled to transmit said pulse signal to said sensing electrode; and means for capacitively shunting said pulse signals away from said shunt element to affect the amount of said pulse signal transmitted to said sensing electrode and thereby cause said capacitance responsive sensing element to be responsive to the amount of said pulse signal shunted by said means for capacitively shunting.

4. The circuit of claim 3, wherein said shunt element is a touch pad for use by an operator.

5. The circuit of claim 1, further comprising a second capacitance responsive sensing element capacitively coupled to receive said pulse signal, said second capacitance responsive sensing element being coupled to said circuit means for measuring, said circuit means for measuring being adapted to differentiate the capacitance activation of either none, one or both of first said and said second capacitance responsive sensing elements by measurement of the amount of said pulse signal received.

6. The circuit of claim 1, further comprising:
    a second electrical source means for providing a second square wave pulse signal;
    a third capacitance responsive sensing element capacitively coupled to receive said second pulse signal and coupled to said circuit means for measuring; and
    circuit means for causing first said and said second electrical source means to output first said and said second pulse signals at different points in time to allow distinguishing at said circuit means for measuring between first said and said second pulse signals by reference to their output times from first said and said second electrical source means.

7. A circuit for measuring the response of a capacitance responsive sensing element, comprising:
    an electrical source means for providing a pulse signal to said capacitance responsive sensing element; and
    circuit means for measuring the amount of said pulse signal transmitted through said capacitance responsive sensing element to provide an indication of the amount of capacitance to which said element is responding, said circuit means for measuring including an operational amplifier having a diode feedback path connected to a common input with said capacitance responsive element.

8. A circuit for measuring the response of a capacitance responsive sensing element, comprising:
    an electrical source means for providing a pulse signal to said capacitance responsive sensing element; and
    circuit means for measuring the amount of said pulse signal transmitted through said capacitance responsive sensing element to provide an indication of the amount of capacitance to which said element is responding, said circuit means for measuring including an operational amplifier, a diode connected between said capacitance responsive sensing element and one input of said operational amplifier, and a parallel resistance-capacitance feedback path connected to said one input of said operational amplifier.

9. A method for measuring the response of a capacitance responsive sensing element comprising the steps of:
    providing a pulse signal to said capacitance responsive sensing element; and
    measuring the amount of said pulse signal transmitted through said capacitance responsive sensing element to provide an indication of the amount of capacitance to which said element is responding, said measuring including applying said pulse signal as received from said capacitance responsive sensing element across the capacitor of a capacitor-resistor time constant circuit and measuring the recovery time of the voltage across said capacitor.

10. The method of claim 9, further comprising the steps of:
    coupling a second capacitance responsive sensing element to said circuit means for measuring and to receive said pulse signal; and
    distinguishing between the activation of either none, one or both of a pair of sensing elements by measuring the amount of said pulse signal measured by said circuit means.

11. The method of claim 9, further comprising the steps of:
    providing a second pulse signal to a third capacitance responsive sensing element, said second pulse signal being provided at a time other than first said pulse signal; and measuring the amount of first said and said second pulse signals transmitted through first said and said third sensing elements respectively with a common circuit means for measuring by reference to the time relationship of first said and said second pulse signals.

12. A method for measuring the response of a capacitance responsive sensing element comprising the steps of:

providing a pulse signal to said capacitance responsive sensing element; and measuring the amount of said pulse signal transmitted through said capacitance responsive sensing element to provide an indication of the amount of capacitance to which said element is responding, said measuring including coupling said pulse signal as transmitted by said capacitance responsive sensing element to one input of an operational amplifier having a diode feedback path connected to said one input.

13. A method for measuring the response of a capacitance responsive sensing element comprising the steps of:

providing a pulse signal to said capacitance responsive sensing element; and measuring the amount of said pulse signal transmitted through said capacitance responsive sensing element to provide an indication of the amount of capacitance to which said element is responding, said measuring including coupling said pulse signal as transmitted by said capacitance responsive sensing element through a diode to one input of a second operational amplifier, said second operational amplifier having a second feedback path connected to said one input thereof, said second feedback path including a parallel resistance-capacitance combination.

* * * * *